(12) United States Patent
Hamada et al.

(10) Patent No.: US 9,713,259 B2
(45) Date of Patent: Jul. 18, 2017

(54) COMMUNICATION MODULE

(71) Applicant: TAIYO YUDEN CO., LTD., Tokyo (JP)

(72) Inventors: Yoshiki Hamada, Tokyo (JP); Hiroshi Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 158 days.

(21) Appl. No.: 14/511,984

(22) Filed: Oct. 10, 2014

(65) Prior Publication Data
US 2015/0282328 A1    Oct. 1, 2015

(30) Foreign Application Priority Data
Mar. 26, 2014 (JP) ................................. 2014-063845

(51) Int. Cl.
*H05K 1/18* (2006.01)
*H05K 1/02* (2006.01)
*H05K 3/46* (2006.01)

(52) U.S. Cl.
CPC .......... *H05K 1/185* (2013.01); *H05K 1/0242* (2013.01); *H05K 3/4608* (2013.01); *H05K 3/4697* (2013.01); *H05K 1/0215* (2013.01)

(58) Field of Classification Search
CPC H05K 1/18; H05K 1/02; H05K 1/185; H05K 1/0242
USPC ......................................................... 361/764
See application file for complete search history.

(56) References Cited

U.S. PATENT DOCUMENTS

| 8,483,104 B1 * | 7/2013 | Saji | ........................ H04B 1/525 370/276 |
| 2009/0237900 A1 * | 9/2009 | Origuchi | ........... H01L 23/49838 361/763 |
| 2014/0153204 A1 * | 6/2014 | Kim | ...................... H05K 3/321 361/762 |
| 2014/0176265 A1 * | 6/2014 | Kato | ....................... H01P 3/085 333/238 |

FOREIGN PATENT DOCUMENTS

JP          5420104 B1    2/2014

* cited by examiner

*Primary Examiner* — Eric Thomas
*Assistant Examiner* — Michael P McFadden
(74) *Attorney, Agent, or Firm* — Chen Yoshimura LLP

(57) ABSTRACT

A circuit substrate having a built-in component includes a core layer that is a conductive layer in which a penetrating hole is formed. A component is disposed in this penetrating hole. A signal wiring line that transmits high frequency signals is formed in a conductive layer facing the core layer on an area projected in the thickness direction of the penetrating hole. The component is provided with a ground conductor functioning as ground that is formed on at least a portion of the area projected in the thickness direction of the signal wiring line.

10 Claims, 12 Drawing Sheets

Comparison Example 2

Working Examples 2 and 3

COMMUNICATION MODULE

BACKGROUND OF THE INVENTION

Technical Field

The present invention relates to a circuit substrate having a built-in component used in a high frequency communication module or the like.

Background Art

A conventional configuration of a circuit substrate having a built-in component used in high frequency communication modules or the like includes stacking insulating layers and conductive layers together and having a metal core layer that is a conductive layer thicker than the other conductive layers and that functions as ground. Various types of electronic components such as duplexers, filters, and the like are arranged in penetrating holes formed in this core layer (see Patent Document 1). In this type of conventional circuit substrate having a built-in component, the core layer is located inside the circuit substrate, and insulating layers and conductive layers are stacked on both the top and bottom of the core layer. A signal wiring line for transmitting high frequency signals is formed in one of the conductive layers facing this core layer. This type of circuit substrate having a built-in component is advantageous due to the core layer ensuring the strength of the circuit substrate and shielding the built-in electronic components.

RELATED ART DOCUMENT

Patent Document

Patent Document 1: Japanese Patent No. 5420104

SUMMARY OF THE INVENTION

In the conventional circuit substrate having a built-in component described above, one of the parameters defining the characteristic impedance of the signal wiring line in the conductive layer is the distance between this signal wiring line and the core layer, which functions as ground. Accordingly, the characteristic impedance of the signal wiring line differs greatly between areas that face the core layer and areas that do not face the core layer, or namely, areas that face the penetrating hole in the core layer. Due to this, circuit substrates were being designed such that the signal wiring lines were not arranged in areas where the penetrating holes formed in the core layer are projected in the thickness direction of the circuit substrate, or in other words, so as to avoid the projection areas of the penetrating holes. In such a design, however, the arrangement and patterning of the components is limited, and thus it was hard to improve mounting density and there was a low degree of design freedom.

In order to solve these issues, a configuration is possible in which a conductive layer having a so-called "block ground," which is a ground conductor with a large area, is interposed between the core layer and the conductive layers where the signal wiring lines are formed. This method, however, increases the numbers of layers, which makes it difficult for the circuit substrate having a built-in component to be thinner.

The present invention was made in view of the above-mentioned situation and aims at providing a circuit substrate having a built-in component that can realize a high mounting density and that can be made thinner.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a circuit substrate having a built-in component, including: a circuit substrate formed by conductive layers and insulating layers being stacked together, one of the conductive layers being a core layer that is thickest among the conductive layers and that has a penetrating hole formed therein; and a component embedded in said penetrating hole, wherein a signal wiring line that transmits high frequency signals is formed in one of the conductive layers facing the core layer, said signal wiring line overlapping at least a portion of the penetrating hole and said core layer function as ground, and wherein the component includes a ground conductor formed so as to overlap at least a portion of the signal wiring line.

According to one aspect of the present disclosure, even if the signal wiring line is in a location where the core layer is not provided, or namely, a location facing the penetrating hole of the core layer, a prescribed impedance can be obtained due to the ground conductor included with the component that is disposed in the penetrating hole. This eliminates the necessity of ensuring that the signal wiring line is not disposed on an area in which the penetrating hole formed in the core layer is projected in the thickness direction of the circuit substrate during while designing the circuit substrate. Accordingly, it is possible to improve mounting density and design freedom.

In one aspect, the present disclosure provides a line width of a portion of the signal wiring line overlapping the ground conductor of the component is greater than a line width of a portion of the signal wiring line not overlapping said ground conductor. With this configuration, the characteristic impedance of the signal wiring line in the areas facing the core layer and the areas not facing the core layer, or namely the penetrating hole, can approximate each other, thereby improving frequency characteristics for the transmission path.

Various types of materials can be used as the built-in component in one aspect of the present invention. In one aspect, the component includes a substrate and a metal member that covers all or part of the substrate and functions as the ground conductor, for example. In another aspect, the component includes a substrate, and the ground conductor is formed in a front layer or inner layer of the substrate, for example. In another aspect, the component includes a circuit substrate in which an insulating layer and a conductive layer that functions as the ground conductor have been stacked together, for example. In another aspect, the component includes a semiconductor component, and the ground conductor is formed on a surface of the semiconductor component, for example.

The circuit substrate having a built-in component of the present invention, as described above, eliminates the necessity of ensuring that the signal wiring line is not disposed on an area in which the penetrating hole formed in the core layer is projected in the thickness direction of the circuit substrate while designing the circuit substrate; therefore, it is possible to improve mounting density and design freedom.

It is to be understood that both the foregoing general description and the following detailed description are exemplary and explanatory, and are intended to provide further explanation of the invention as claimed.

BRIEF DESCRIPTION OF THE DRAWINGS

FIG. 4 is a plan view for explaining the relationship between the signal wiring line, the ground conductor, and the like.

FIG. 5 is a plan view according to another example for explaining the relationship between the signal wiring line, the ground conductor, and the like.

FIG. 6 is a plan view according to another example for explaining the relationship between the signal wiring line, the ground conductor, and the like.

FIG. 7 is a plan view according to another example for explaining the relationship between the signal wiring line, the ground conductor, and the like.

FIG. 8 is a plan view according to another example for explaining the relationship between the signal wiring line, the ground conductor, and the like.

FIG. 9 is a plan view according to another example for explaining the relationship between the signal wiring line, the ground conductor, and the like.

DETAILED DESCRIPTION OF EMBODIMENTS

Embodiment 1

Figure 1:
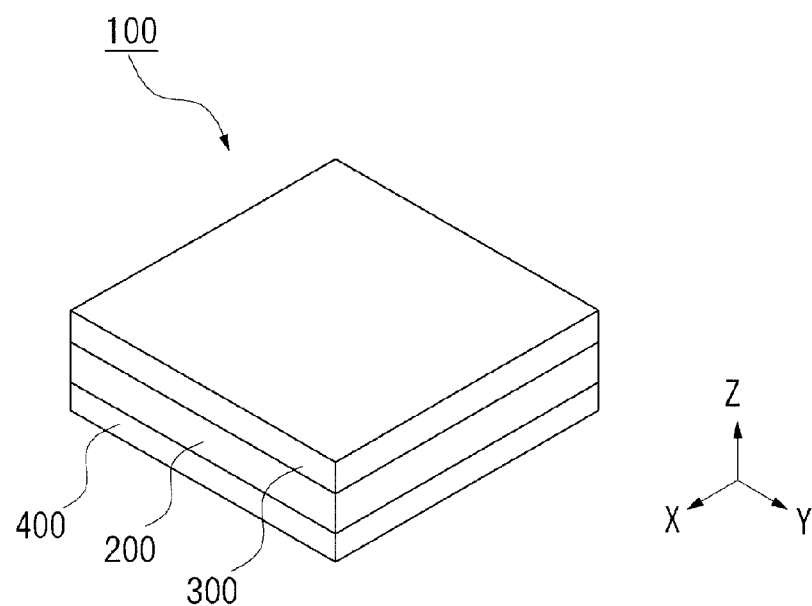
FIG. 1 is an external perspective view of a circuit substrate with a built-in component according to Embodiment 1.

A circuit substrate having a built-in component according to Embodiment 1 of the present invention will be explained with reference to the drawings. FIG. 1 is an external perspective view of the circuit substrate having a built-in component, FIG. 2 is a cross-sectional view of FIG. 1 in the X axis direction, and FIG. 3 is a cross-sectional view of FIG. 1 in the Y axis direction.

In the present embodiment, a configuration will be described in which various types of electronic components are mounted on one main surface of a circuit substrate having a built-in component, and sealing members are disposed on this entire main surface in order to cover these electronic components. The substrate is then mounted on a mother circuit board as a circuit module. In the present embodiment, a circuit substrate having a built-in component used in a communication module and having various types of communication functions including mobile phone communication functions concentrated thereon will be described.

A circuit substrate having a built-in component 100 is a multilayer substrate formed by stacking conductive layers and insulating layers. As shown in FIG. 1, the circuit substrate having a built-in component 100 includes: a core layer 200, which is a relatively thick metal conductive layer with good conductivity; stacked layers 300 formed on one main surface (the top) of the core layer 200; and stacked layers 400 formed on the other main surface (the bottom) of the core layer 200. The stacked layers 300 and the stacked layers 400 are made by using the build-up method on both main surfaces of the core layer 200.

Figure 2:
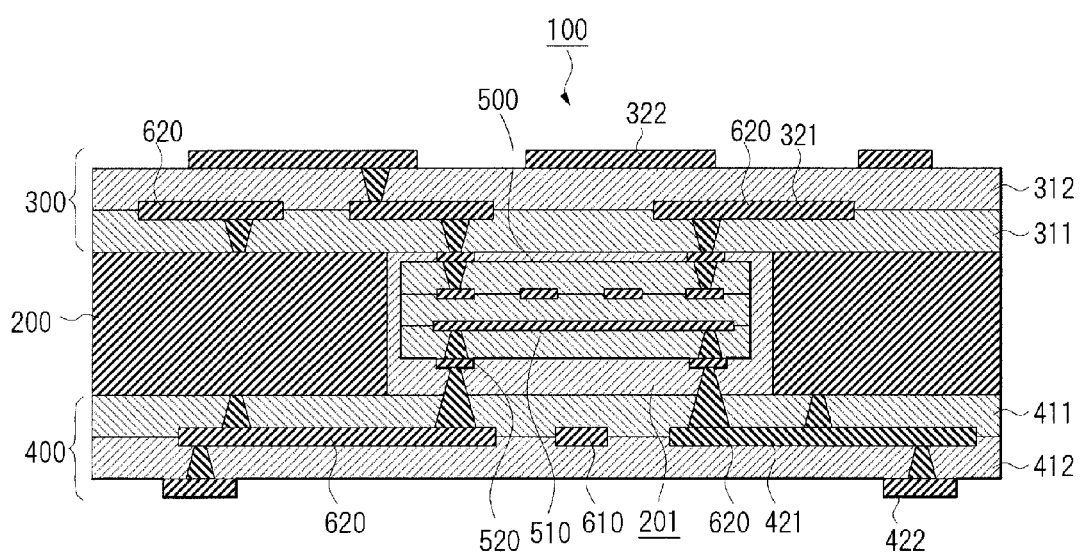
FIG. 2 is a cross-sectional view of FIG. 1 in the X axis direction.
Figure 3:
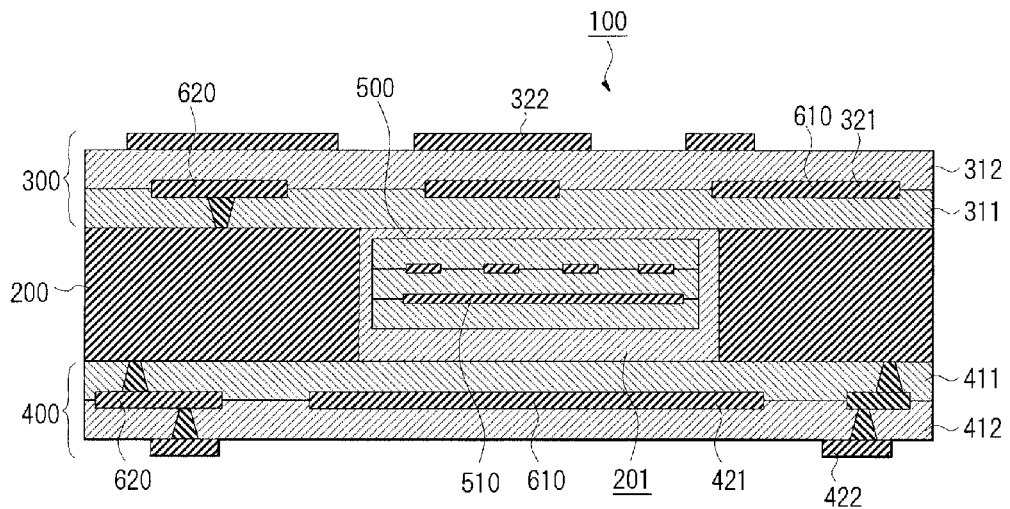
FIG. 3 is a cross-sectional view of FIG. 1 in the Y axis direction.

As shown in FIGS. 2 and 3, the stacked layers 300 and 400 respectively include a plurality (two in the present embodiment) of insulating layers 311 to 312 and 411 to 412, and conductive layers 321 to 322 and 421 to 422. The insulating layers 311 and 411 are adjacent to the respective main surfaces of the core layer 200. The conductive layers 321 and 421 are conductive layers that are inside the stacked layers 300 and 400 and that face the respective main surfaces of the core layer 200. The conductive layers 322 and 422 are surface layers that are exposed on respective surfaces of the circuit substrate having a built-in component 100. Circuit patterns that transmit high frequency signals, lands for mounting the various types of components, inspection pads and the like are formed in the conductive layer 322. Terminal electrodes for connecting with the mother circuit board, lands for mounting the various types of components, and the like are formed in the conductive layer 422. Well-known via holes or through-holes are used for connection between the conductive layers.

A penetrating hole 201 for housing the components is formed in the core layer 200. A component 500, described later, is disposed in the penetrating hole 201. Therefore, it is preferable that the thickness of the core layer 200 be greater than the height of the electronic component 500 stored therein and that the core layer have a great bending strength. The core layer 200 is made of an electrically conductive material and provided with a reference potential (ground). Therefore, the core layer 200 can be regarded as one conductive layer of the circuit substrate having a built-in component 100. In the present embodiment, the core layer 200 is made of a metal plate, or more specifically, a metal plate made of copper or a copper alloy. Spaces around the built-in component 500 in the penetrating hole 201 are filled with an insulating member such as a resin.

A signal wiring line 610 that transmits high frequency signals and ground conductors 620 that function as ground are formed in the conductive layers 321 and 421 in the stacked layers 300 and 400. The ground conductors 620 are connected to the ground conductors in the core layer 200 and the conductive layers 322 and 422 through via holes.

A first characteristic of one aspect of the present invention is the wiring pattern of the signal wiring line 610 in the conductive layers 321 and 421. Specifically, at least a portion of the signal wiring line 610 is formed in the conductive layers 321 and 421 in an area of the circuit substrate having the built-in component 100 projected in the thickness direction of the penetrating hole 201 in the core layer 200. In the present embodiment, as shown in FIGS. 2 and 3, this type of signal wiring line 610 is formed in the insulating layer 411, which is inside the stacked layer 400 located on the side that will be mounted onto the mother circuit board.

A second characteristic of one aspect of the present invention is that the component 500 disposed inside the penetrating hole 201 includes the ground conductor 510 that functions as ground, and this ground conductor is formed at least on part or all of an area corresponding to the signal wiring line 610 projected in the thickness direction thereof. In the present embodiment, the circuit substrate 500 is used as the component 500 instead of electronic components such as filter devices, ICs (integrated circuits), or the like, for example. The circuit substrate 500 may be a substrate with built-in components that has various types of electronic components embedded therein, such as capacitors, inductors, and resistors, or the circuit substrate may be a printed wiring board or the like on which only wiring lines are formed. Various configurations can be used for the shape of this circuit substrate having built-in components. This includes configurations made of low temperature co-fired ceramic (LTCC), configurations made by integrated pass device (IPD) technology, and methods in which electronic components are embedded in a resin substrate.

In the circuit substrate having a built-in component 100 of the present embodiment, which has the core layer 200 that is thicker than other conductive layers, the potential wiring area inside the substrate is smaller than circuit substrates that do not have the stacked core layer. The present embodiment, however, has the advantages of increasing the potential wiring area and degree of design freedom by embedding a different circuit substrate 500 as a built-in component into the penetrating hole 201 in the core layer 200. In particular, the circuit substrate 500, which is a built-in component, can be manufactured in a separate process from the circuit substrate having a built-in component 100, and sealed into the penetrating hole 201; therefore, it is possible to use a configuration allowing for high density and precision as the circuit substrate 500. This makes it possible to obtain a higher mounting density as a whole.

As described above, in one aspect of the present invention, the ground conductor 510 layer is formed on the circuit substrate 500, which is the built-in component. This ground conductor 510 connects to terminal electrodes 520 on the surface or side of the circuit substrate 500 through via holes or the like in the circuit substrate 500, and ultimately connects to an area given a ground potential in the circuit substrate having a built-in component 100 through via holes or the like therein. In the present embodiment, the ground conductor 510 is electrically connected to the core layer 200 via the ground conductors 620.

Figure 4:
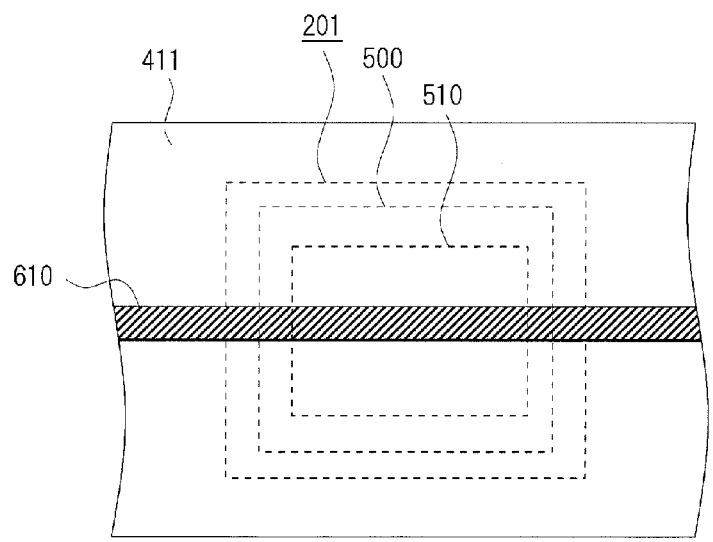

Next, the relationship among the signal wiring line 610, the penetrating hole 201, the circuit substrate 500 that is a built-in component, and the ground conductor 510 of the circuit substrate 500 will be explained with reference to FIG. 4. FIG. 4 is a plan view of the insulating layer 411 where the signal wiring line 610 is formed as seen from the bottom surface side of the circuit substrate having a built-in component 100. As shown in FIG. 4, the signal wiring line 610 is formed so as to go across the rectangular penetrating hole 201. The width of the signal wiring line 610 is constant throughout. The component 500 is disposed in the penetrating hole 201 at a prescribed distance from the inner walls thereof. The ground conductor 510 on the component 500 has a rectangular shape that is slightly smaller than the outer appearance of the component 500.

With the circuit substrate having a built-in component 100 according to the present embodiment, a desired characteristic impedance of the signal wiring line 610 is obtained with ease due to the ground conductor 510 formed on the circuit substrate 500, which is a built-in component, even in an area in the projection of the penetrating hole 201. This eliminates the need to restrict the design of the circuit substrate having a built-in component 100 to ensure that the signal wiring line 610 is not disposed in an area where the penetrating hole 201 formed in the core layer 200 is projected in the thickness direction of the circuit substrate having a built-in component 100. Accordingly, this can improve mounting density and improves the degree of design freedom.

Figure 5:
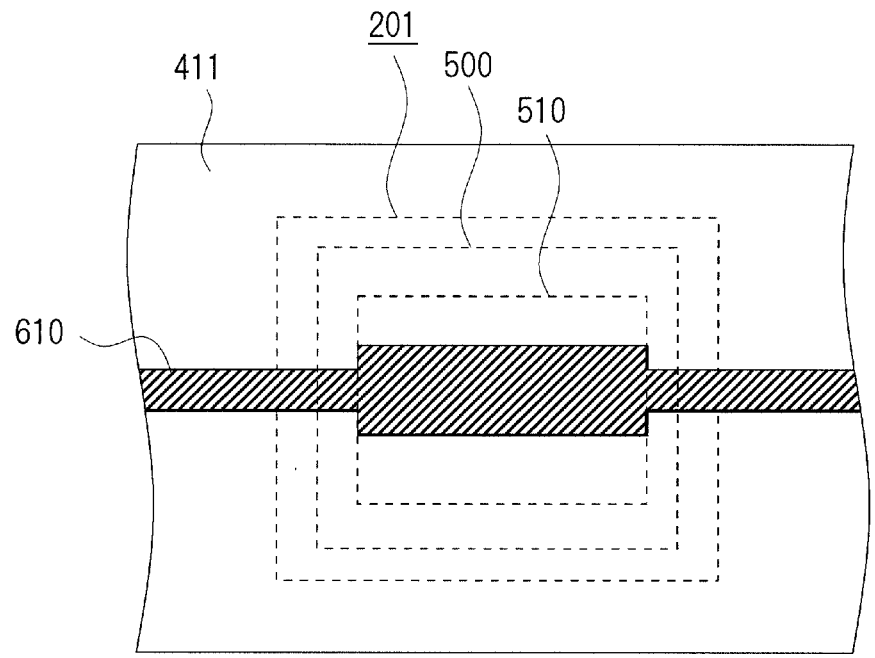
Figure 6:
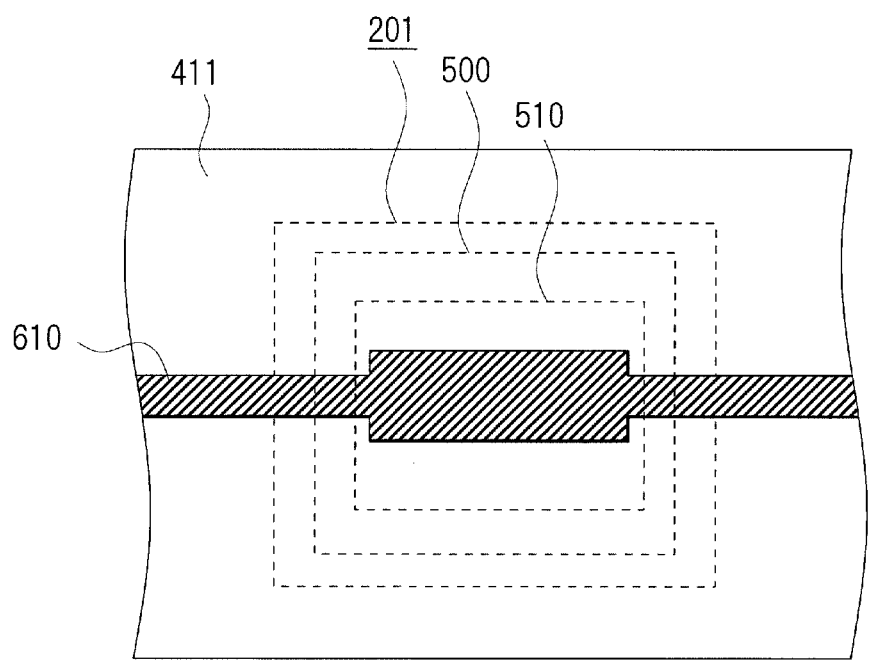
Figure 7:
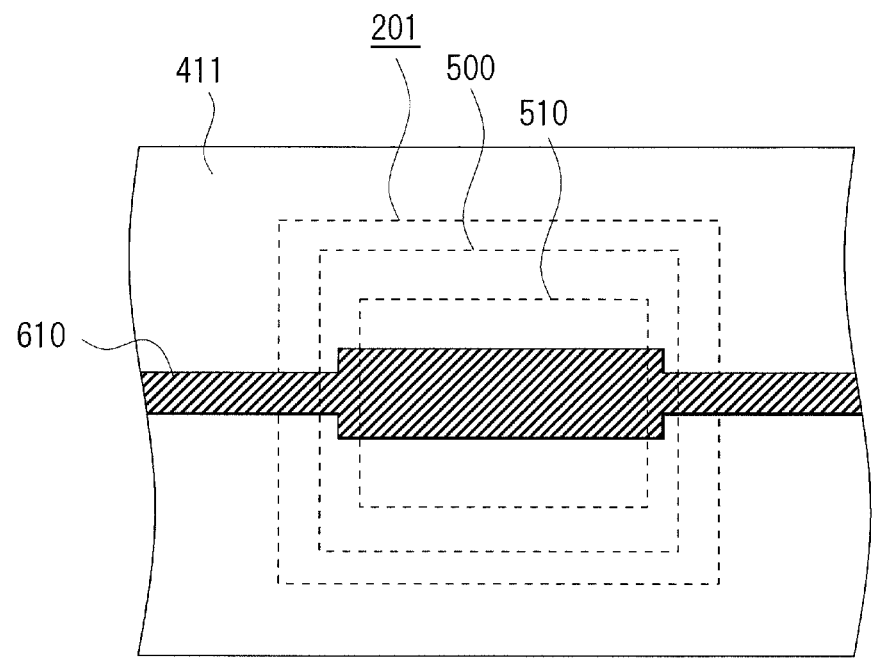
Figure 8:
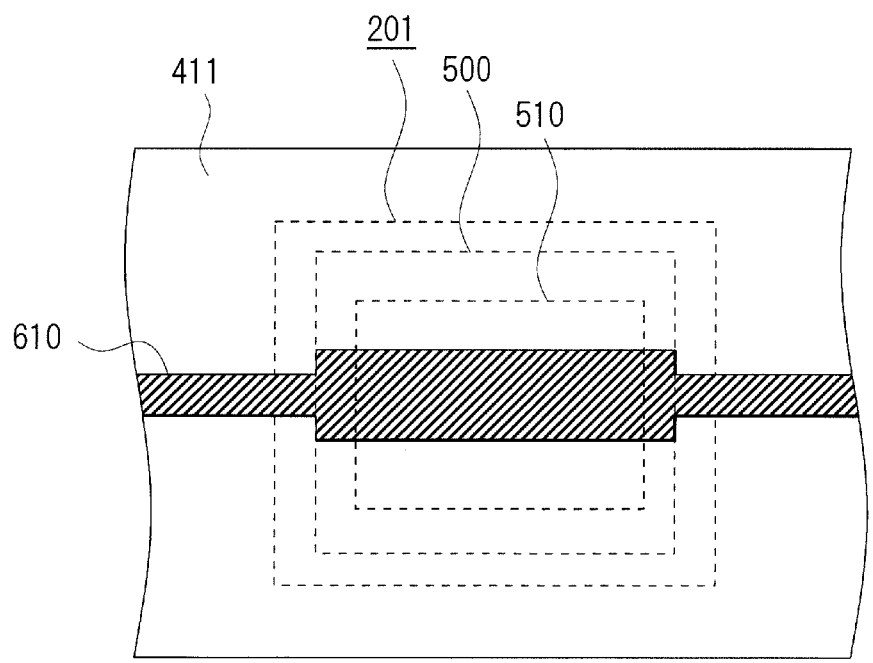
Figure 9:
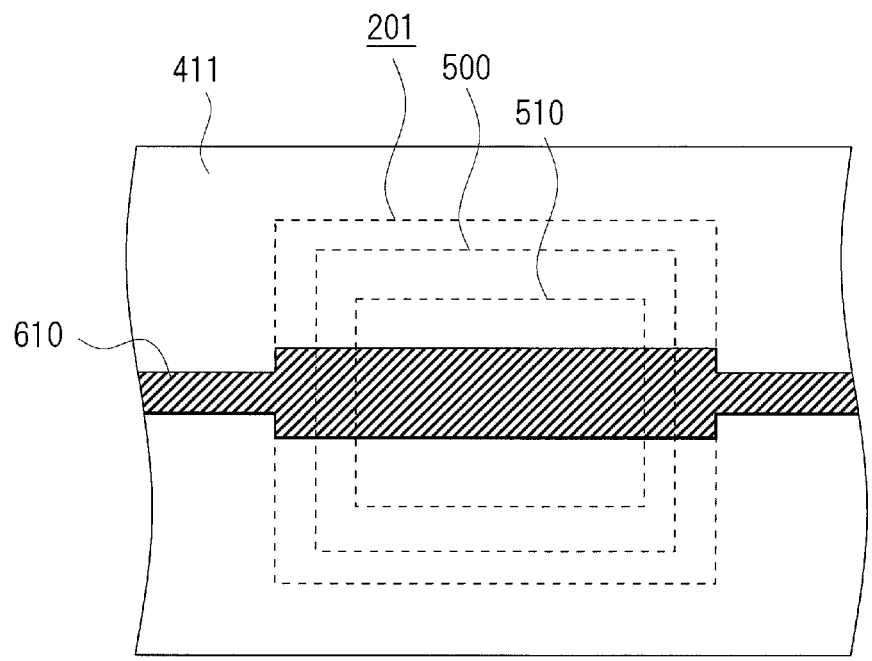

As shown in FIG. 5, the line width of the signal wiring line 610 can be made larger in other areas in at least the projection area of the ground conductor 510 on the circuit substrate 500, or specifically, areas that face the core layer 200. This makes it possible to reduce the difference in characteristic impedance between the area facing the core layer 200 and the area facing the penetrating hole 201. It is not necessary for the ends of the area where the signal wiring line 610 is large to strictly match the ends of the ground conductor 510. In other words, slight deviation is permissible as long as a characteristic impedance is obtained that is within a sufficient range for the desired circuit characteristics. Specifically, the ends of the signal wiring line 610 where the line width is large may be inside the ends of the ground conductor 510, as shown in FIG. 6, for example, or the ends of the signal wiring line 610 where the line width is large may be outside the ends of the ground conductor 510, as shown in FIG. 7, for example. The location of the ends of the signal wiring line 610 where the line width thereof is large may correspond to the ends of the circuit substrate 500 as shown in FIG. 8 or may correspond to the ends of the penetrating hole 201 as shown in FIG. 9, instead of corresponding to the ends of the ground conductor 510. In these cases, the ends of the signal wiring line where the line width thereof is large need not strictly match the ends of the circuit substrate 500 or the ends of the penetrating hole 201. In other words, slight deviation is permissible as long as a characteristic impedance is obtained that is within a sufficient range for the described circuit characteristics.

Embodiment 2

Figure 10:
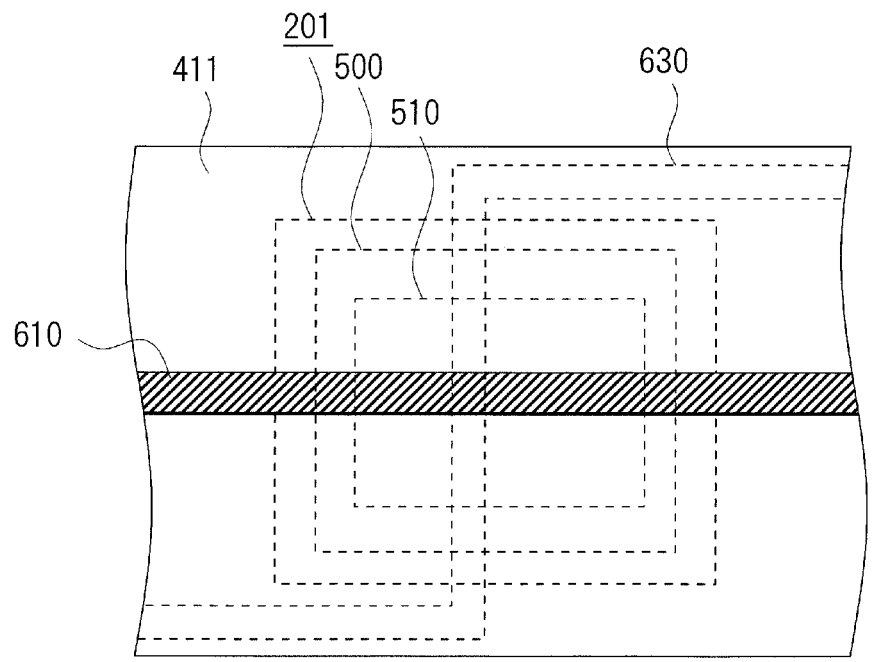
FIG. 10 is a plan view for explaining the relationship between a signal wiring line, a ground conductor, and the like in a circuit substrate having a built-in component according to Embodiment 2.

Next, Embodiment 2 of the present invention will be explained with reference to the drawings. In the circuit substrate having a built-in component 100 according to Embodiment 1, only the signal wiring line 610 formed in the conductive layer 421 on one side of the core layer 200 goes across the projection area of the penetrating hole 201. In a circuit substrate having a built-in component 110 according to the present embodiment, as shown in FIG. 10, a signal wiring line 630 formed in a conductive layer 321 on the other side of a core layer 200 also goes across the projection area of a penetrating hole 201. When the circuit substrate having a built-in component 110 is projected in the thickness direction, a signal wiring line 610 and the signal wiring line 630 intersect and a ground conductor 510 of a circuit substrate 500 that is a built-in component is disposed at least at the intersection of the signal wiring line 610 and the signal wiring line 630.

In this type of circuit substrate having a built-in component 110, the ground conductor 510 on the circuit substrate 500 that is a built-in component is interposed between the signal wiring line 610 and the signal wiring line 630; therefore, it is possible to suppress interference between the signal wiring lines, or namely, cross-talk. Other functions and effects are similar to Embodiment 1. Needless to say, modifications that are similar to those in Embodiment 1 can be applied to the present embodiment.

Embodiment 3

Figure 11:
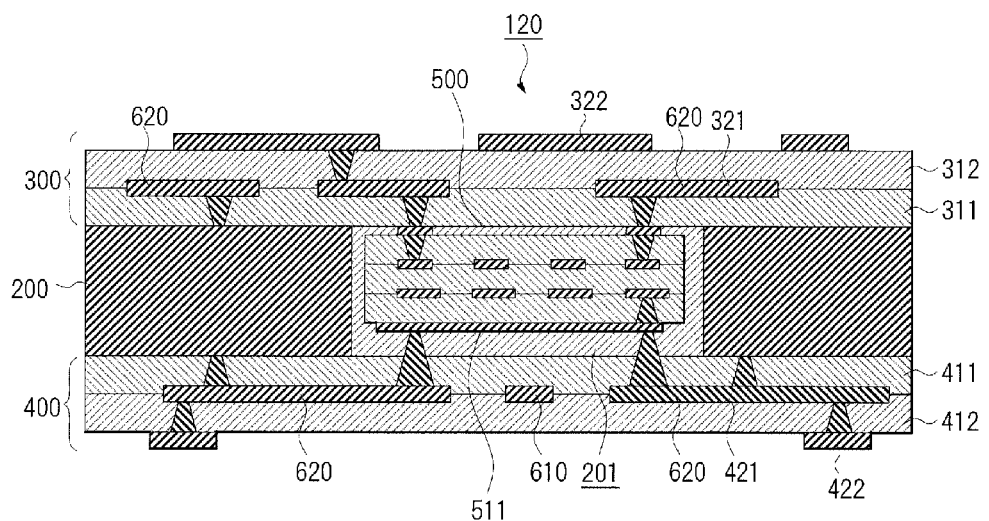
FIG. 11 is a cross-sectional view of a circuit substrate having a built-in component according to Embodiment 3.

A circuit substrate having a built-in component according to Embodiment 3 of the present invention will be explained with reference to FIG. 11. FIG. 11 is a cross-sectional view of the circuit substrate having a built-in component according to Embodiment 3.

The present embodiment differs from the respective embodiments above in the configuration of a circuit substrate 500, which is a built-in component. Other configurations are similar to the respective embodiments above. As shown in FIG. 11, in a circuit substrate with a built-in component 120 according to the present embodiment, a ground conductor 511 of the circuit substrate 500 is formed on the surface layer of this circuit substrate 500. The ground conductor 511 connects to a ground conductor 620 of a conductive layer 421 through well-known via holes. The ground conductor 620, as described above, connects to a core layer 200 through well-known via holes.

The effects of this type of circuit substrate having a built-in component 120 are similar to the respective embodiments above. Needless to say, modifications that are similar to those in the respective embodiments above can be applied to the present embodiment.

Embodiment 4

Figure 12:
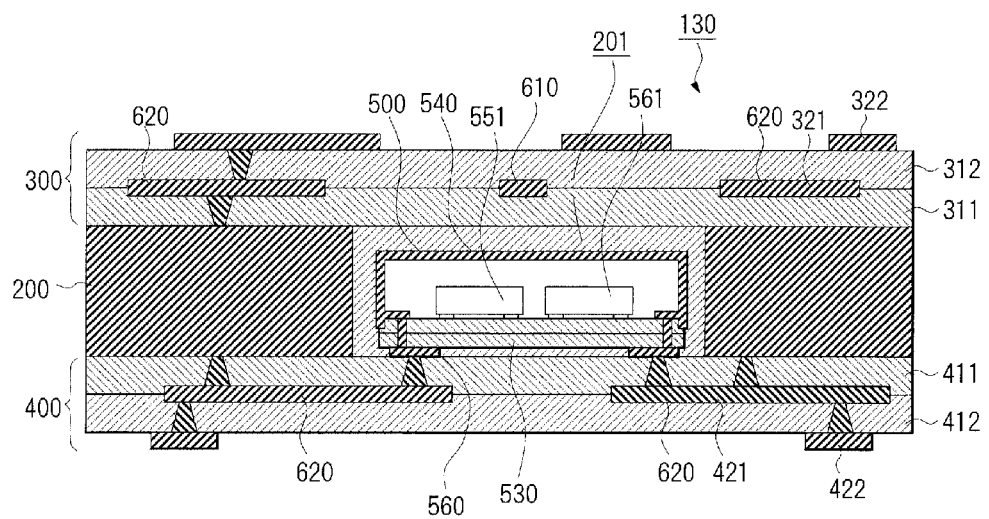
FIG. 12 is a cross-sectional view of a circuit substrate having a built-in component according to Embodiment 4.

A circuit substrate having a built-in component according to Embodiment 4 of the present invention will be explained with reference to FIG. 12. FIG. 12 is a cross-sectional view of the circuit substrate having a built-in component according to Embodiment 4.

The present embodiment differs from the respective embodiments above in the type of built-in component 500. Other configurations are similar to the respective embodiments above. As shown in FIG. 12, in a circuit substrate having a built-in component 130 according to the present embodiment, a substrate 530 and a metal case 540 that covers all or part of this substrate 530 and that functions as ground are used as a built-in component 500. An example of this type of built-in component 500 includes filter devices such a surface acoustic wave filter (SAW) or a bulk acoustic wave filter (BAW), or passive components such as duplexers, triplexers, and quadplexers that have a plurality of these filter devices. A duplexer that includes a transmission filter 551 and a reception filter 552 was used as the built-in component 500 in the present embodiment. A ground conductor 560 is formed on the bottom of this duplexer 500. The ground conductor 560 connects to the case 540 through a via hole in the substrate 530 of the duplexer 500. The ground conductor 560 connects to a ground conductor 620 of a conductive layer 421 through well-known via holes. The ground conductor 620, as described above, connects to a core layer 200 through well-known via holes. In the circuit substrate having a built-in component 130 according to the present embodiment, a signal wiring line 610 is formed in an area of a conductive layer 321 facing the case 540.

The effects of this type of circuit substrate having a built-in component 130 are similar to the respective embodiments above. Needless to say, modifications that are similar to those in the respective embodiments above can be applied to the present embodiment.

Embodiment 5

Figure 13:
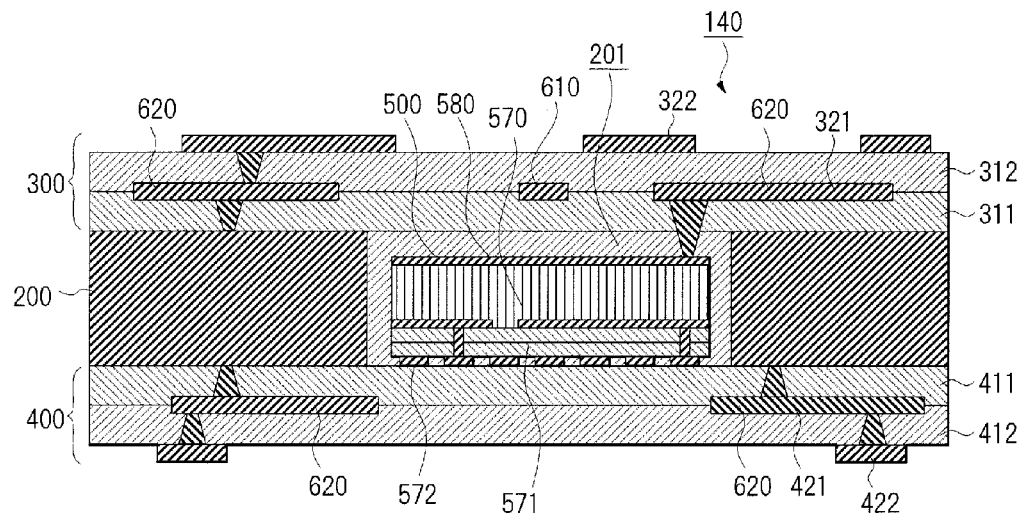
FIG. 13 is a cross-sectional view of a circuit substrate having a built-in component according to Embodiment 5.

A circuit substrate having a built-in component according to Embodiment 5 of the present invention will be explained with reference to FIG. 13. FIG. 13 is a cross-sectional view of the circuit substrate having a built-in component according to Embodiment 5.

The present embodiment differs from the respective embodiments above in the type of built-in component 500. Other configurations are similar to the respective embodiments above. In a circuit substrate having a built-in component 140 according to the present embodiment, an IC (integrated circuit), which is an active component, is used as the built-in component 500. The IC 500 has a ground layer 580 formed on one main surface (the top) thereof and a terminal electrode formed on the other main surface (the bottom). Various configurations can be used for the form of the IC 500. Examples of this include a BGA (ball grid array), CSP (chip size package), or a WL-CSP (wafer level-chip size package). In the present embodiment, a WL-CSP is used. As shown in FIG. 13, the IC 500 has the ground layer 580 formed on a surface of the conductor (bare chip) 570 as a support substrate. The ground layer 580 is connected to the ground conductor 620 formed in the conductive layer 321 through a well-known via hole. As described above, the ground conductor 620 is connected to the core layer 200 through a well-known via hole. The terminal of the conductor 570 is drawn out from a terminal electrode 572 on the bottom surface of the IC 500 via a connecting structure 571. In the circuit substrate having a built-in component 140 according to the present embodiment, a signal wiring line 610 is formed in an area of the IC 500 facing the ground layer 580.

The effects of this type of circuit substrate having a built-in component 140 are similar to the respective embodiments above. Needless to say, modifications that are similar to those in the respective embodiments above can be applied to the present embodiment.

Figure 14:
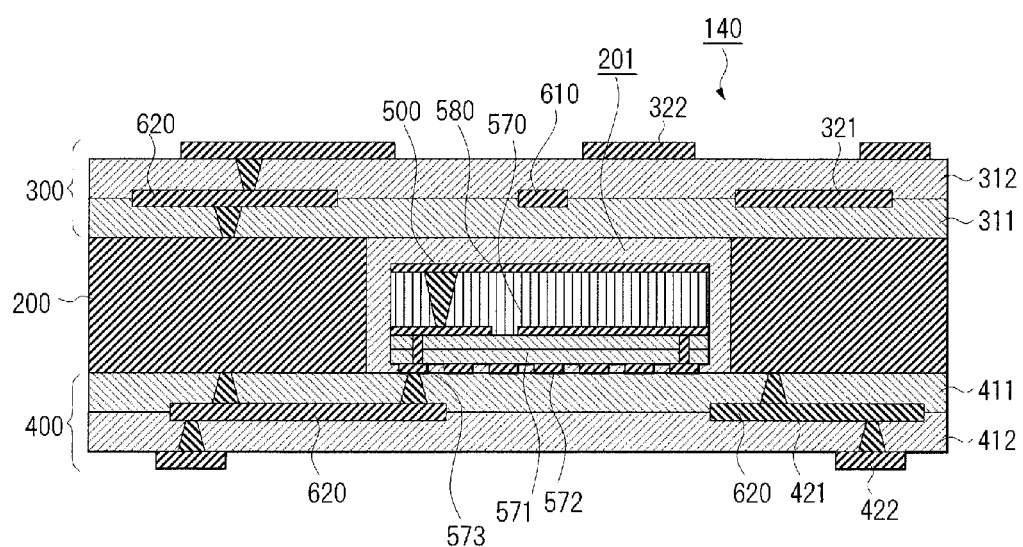
FIG. 14 is a cross-sectional view of the circuit substrate having a built-in component according to another example in Embodiment 5.

In the present embodiment, the ground layer 580 of the IC 500 is connected to the ground conductor 620 formed in the conductive layer 321 facing the ground layer 580 via a via hole. As shown in FIG. 14, as long as the ground layer 580 is connected to the ground conductor in the IC 500 through the via holes in the conductor 570, a ground terminal 573 of the IC 500 may be connected to the ground conductor 620 formed in the conductive layer 421 through a well-known via hole.

Embodiments 1 to 5 of the present invention were described above, but the present invention is not limited to these. In the respective embodiments described above, only one component 500 was disposed in the penetrating hole 201 formed in the core layer 200, but a plurality of the components 500 may be disposed in the penetrating hole 201.

In the respective embodiments above, a circuit substrate having a built-in component was described as being used for a circuit module, but the present invention can also be applied to other uses.

WORKING EXAMPLES

Figure 15:
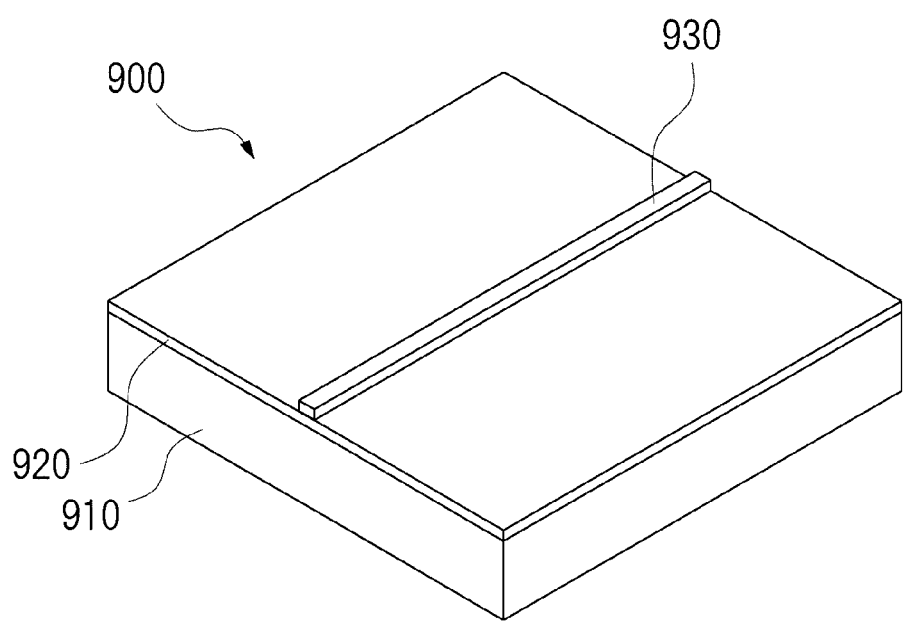
FIG. 15 is a view for explaining Comparison Example 1.
Figure 16:
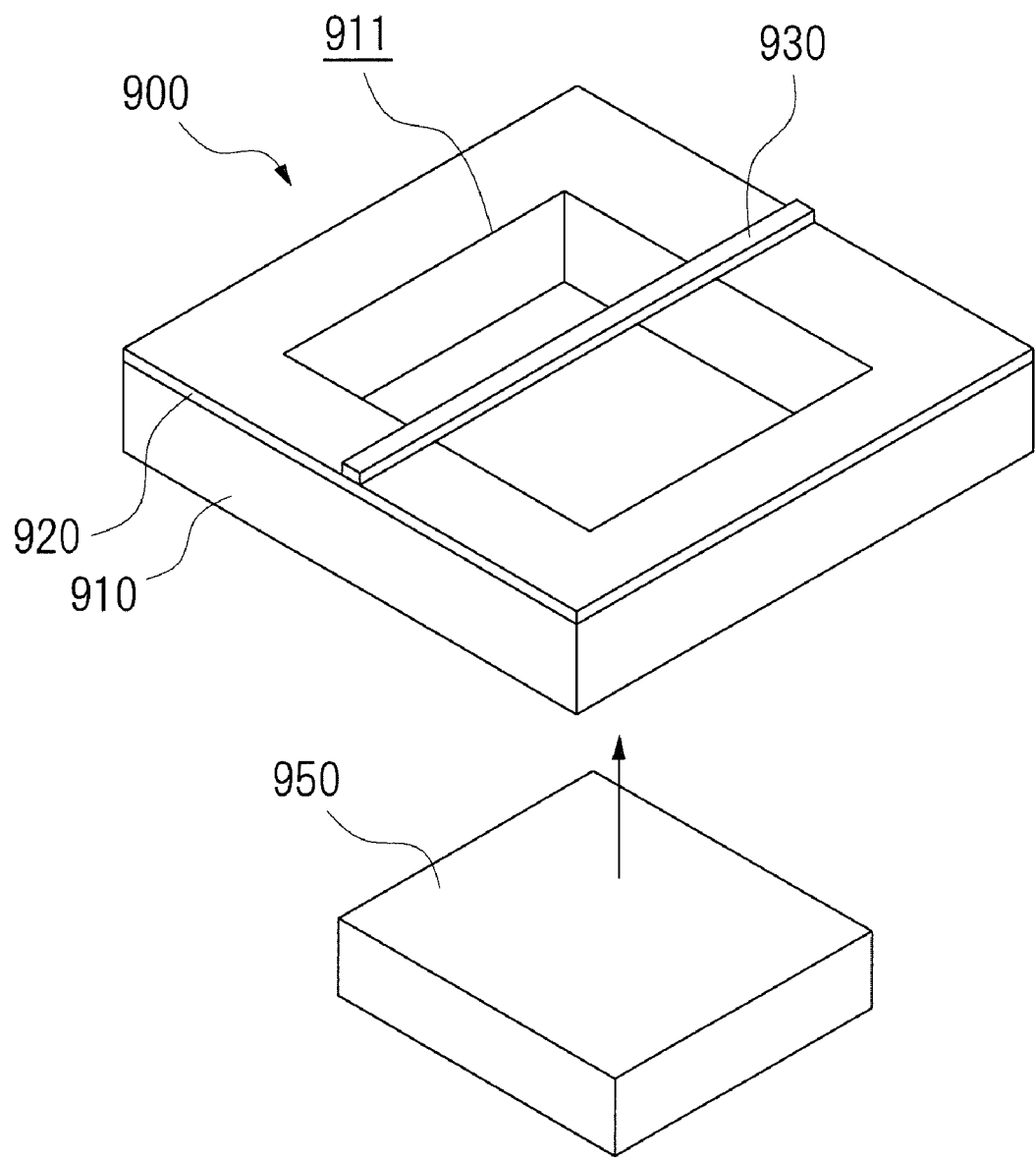
FIG. 16 is a view for explaining Comparison Example 2.

Working examples of the present invention will be described with reference to the drawings. A simulation was performed with the models described below in order to test the effects of the present invention. First, comparison examples will be explained. As shown in FIG. 15, a circuit substrate 900 in Comparison Example 1 is formed by stacking a core layer 910 having a thickness of 340 µm and an insulating layer 920 having a thickness of 25 µm. A signal wiring line 930 having a width of 45 µm is formed in a straight line on the top of the insulating layer 920. As shown in FIG. 16, the circuit substrate 900 in Comparison Example 2 has a penetrating hole 911 formed in the core layer 910 of Comparison Example 2, and has a component 950 without a shield conductor disposed in this penetrating hole 911.

Figure 17:
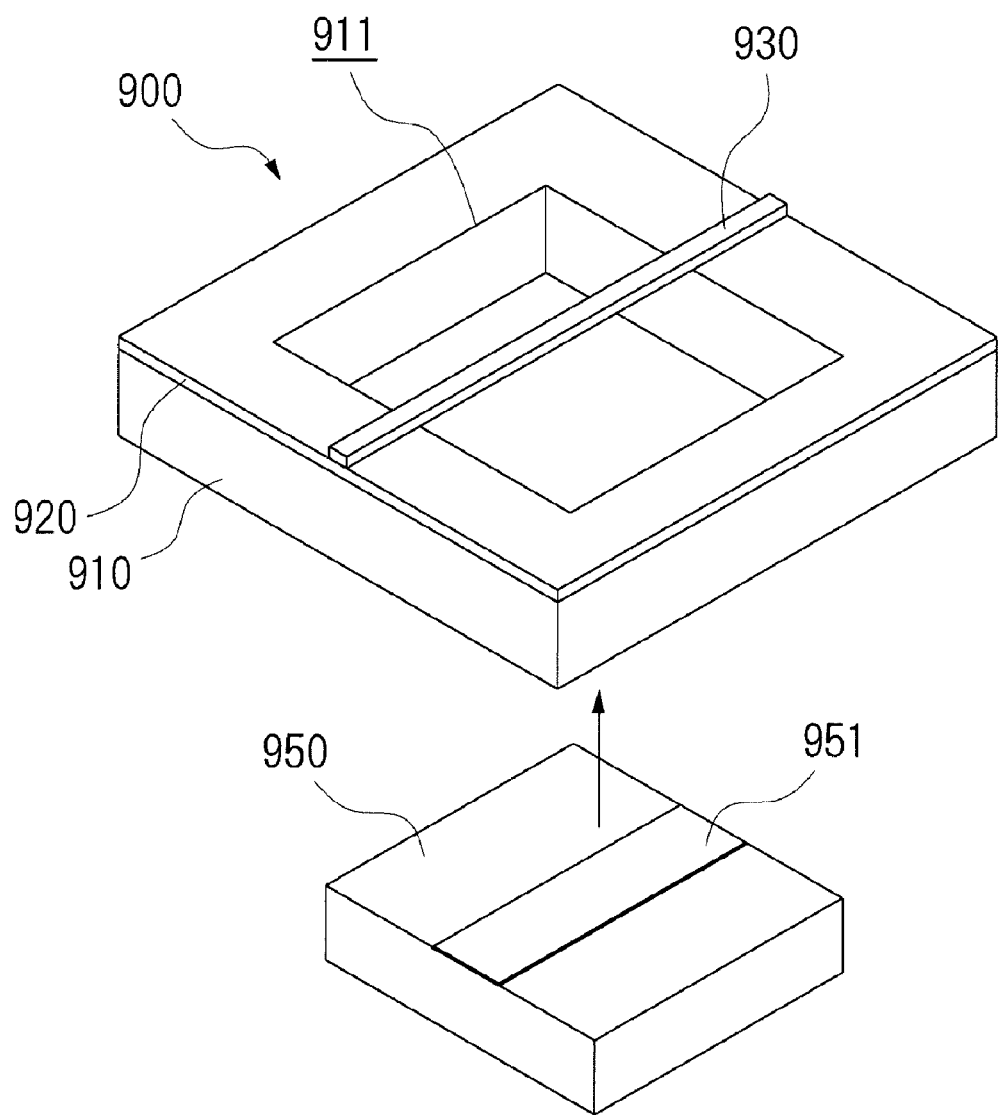
FIG. 17 is a view for explaining Working Example 1.

As shown in FIG. 17, Working Example 1 is similar to Comparison Example 2, but has a shield conductor 951 formed in at least the projection area of the signal wiring line 930 on the surface of the component 950. The shield conductor 951 has a width of 200 µm. The width of the signal wiring line 930 in Working Example 1 is 45 µm, which is the same as the respective comparison examples.

Figure 18:
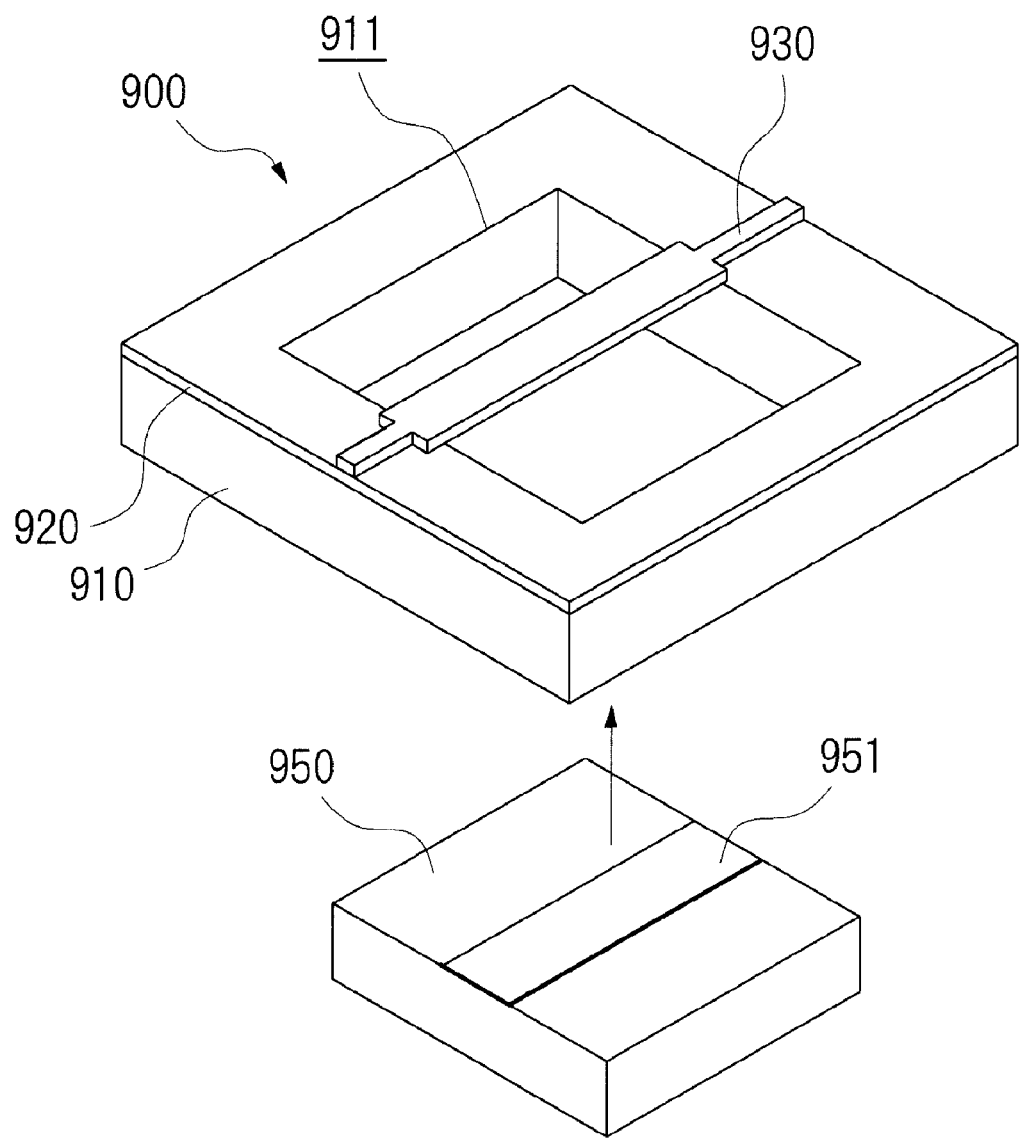
FIG. 18 is a view for explaining Working Examples 2 and 3.

As shown in FIG. 18, Working Examples 2 and 3 are similar to Working Example 1, but the width of the signal wiring line 930 in areas facing the penetrating hole 911 is thicker than other areas. The width of the signal wiring line 930 in areas facing the penetrating hole 911 is 100 µm in Working Example 2 and 120 µm in Working Example 3. The width of the signal wiring line 930 in areas not facing the penetrating hole 911 is 45 µm, which is the same as Working Example 1. In FIGS. 16 to 18, for convenience of explanation the width is shown as passing through the insulating layer 920.

Figure 19:
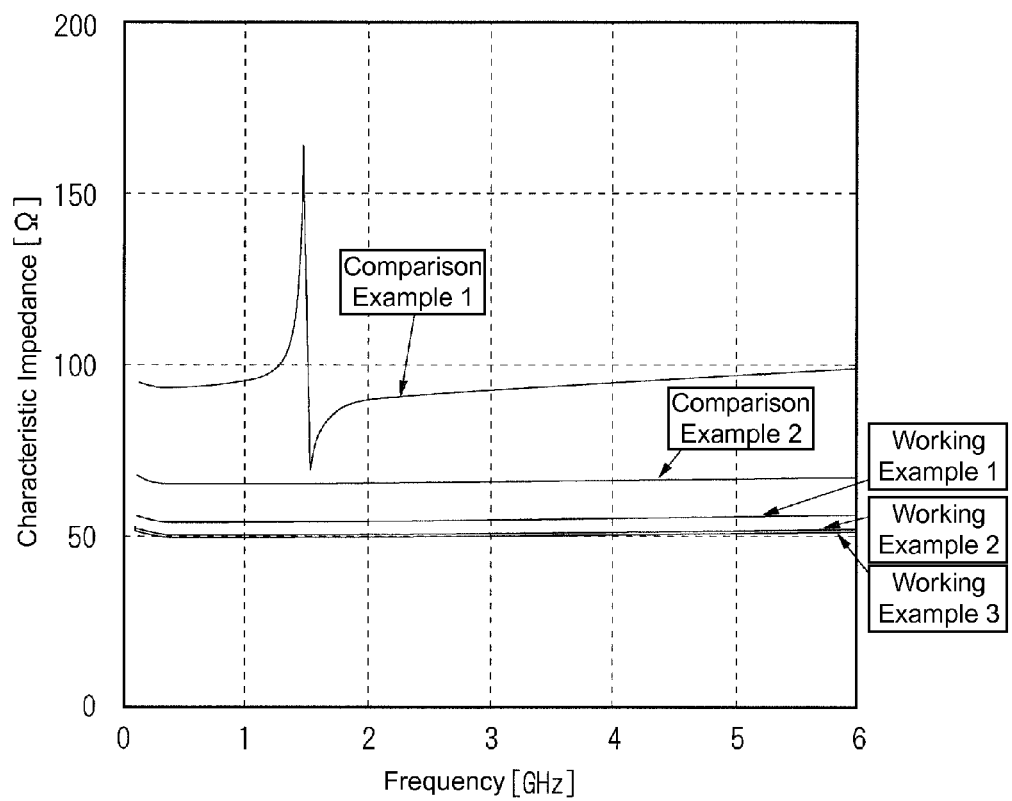
FIG. 19 shows simulation results of the characteristic impedances from the comparison examples and embodiments.

The characteristic impedance of the signal wiring line 930 in the respective comparison examples and respective working examples was simulated in the above-mentioned type of environment at a range of 100 MHz to 6 GHz. FIG. 19 shows the results of this simulation. As can be seen in FIG. 19, the characteristic impedance of Working Examples 1 to 3 of the present invention is lower and more stable than the respective comparison examples. In particular, the characteristic impedance of Working Examples 2 and 3 is even lower and more stable than in Working Example 1. This means that it is possible to reduce the thickness of the insulating layer 920 in Working Examples 1 to 3 of the present invention more than the respective comparison examples in order to achieve a desired characteristic impedance. Thus, it is possible to also form the signal wiring line 930 on areas facing the penetrating hole 901 in the circuit substrate 900 the penetrating hole 911 forming in the core layer 910 according to the present invention; therefore, mounting density can be improved, and the thickness of the circuit substrate 900 can be minimized.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A circuit substrate having a built-in component, comprising:
   conductive layers and insulating layers stacked together, one of the conductive layers being a core layer that is thickest among the conductive layers and that has a penetrating hole formed therein, said core layer being configured to be grounded; and
   a component embedded in said penetrating hole,
   wherein a signal wiring line that is configured to transmit high frequency signals is formed in one of the conductive layers facing the core layer, said signal wiring line overlapping an entire length or width of the penetrating hole and thereby passing across the penetrating hole in a plan view, and
   wherein the component includes a ground conductor configured to be grounded, the ground conductor having a planar shape extending towards peripheral edges of the component and overlapping a portion of the signal wiring line that passes across the penetrating hole in the plan view.

2. The circuit substrate having a built-in component according to claim 1, wherein a line width of a portion of the signal wiring line overlapping the ground conductor of the component is greater than a line width of a portion of the signal wiring line not overlapping said ground conductor.

3. The circuit substrate having a built-in component according to claim 1, wherein the component further comprises a substrate, and said ground conductor covers substantially all area of the substrate.

4. The circuit substrate having a built-in component according to claim 1,
   wherein the component further comprises a substrate, and
   wherein said ground conductor is formed in a front layer or inner layer of the substrate.

5. The circuit substrate having a built-in component according to claim 1,
   wherein the component comprises a multilayer substrate in which an insulating layer and said ground conductor have been stacked together.

6. The circuit substrate having a built-in component according to claim 1,
   wherein the component comprises a semiconductor component, and
   wherein said ground conductor is formed on a surface of the semiconductor component.

7. The circuit substrate having a built-in component according to claim 2, wherein the component further comprises a substrate, and said ground conductor covers substantially all area of the substrate.

8. The circuit substrate having a built-in component according to claim 2,
   wherein the component comprises a substrate, and
   wherein said ground conductor is formed in a front layer or inner layer of the substrate.

9. The circuit substrate having a built-in component according to claim 2,
   wherein the component comprises a multilayer substrate in which an insulating layer and said ground conductor have been stacked together.

10. The circuit substrate having a built-in component according to claim 2,
    wherein the component comprises a semiconductor component, and
    wherein said ground conductor is formed on a surface of the semiconductor component.

* * * * *